GOLD-SILICON BONDING PROCESS

Filed Sept. 6, 1968

ROBERT E. HICKS
INVENTOR

BY J. O. Tresansky
ATTORNEY

United States Patent Office 3,585,711
Patented June 22, 1971

3,585,711

GOLD-SILICON BONDING PROCESS

Robert E. Hicks, Baltimore, Md., assignor to the United States of America as represented by the Secretary of the Navy Filed Sept. 6, 1968, Ser. No. 757,873
Int. Cl. B23k 31/02
U.S. Cl. 29—492 4 Claims

ABSTRACT OF THE DISCLOSURE

A process is disclosed whereby bonding of a semiconductor chip to an aluminum-coated substrate is effected in the presence of chromium. The present method contemplates using aluminum and gold silicon as the bonding agent with the chromium acting as a catalyst in the presence of heat and pressure for facilitating a good bond.

BACKGROUND AND SUMMARY OF THE INVENTION

In microelectronics packaging and fabrication, it is often necessary to bond electrodes or other leads to a surface contact material. Such an integrated circuit requires a surface contact material which exhibits high electrical conductivity so that the surface area of the contact material may be kept relatively small, an important consideration in microelectronics. Aluminum proves to be a suitable contact material since, in addition to its high electrical conductivity, it is inexpensive, readily available and easy to work with. However, aluminum tends to form undesirable inter-metallic compounds when alloyed with certain wire lead materials, resulting in brittle and weak bonds. Aluminum contact materials have not, therefore, found extensive application as a circuit surface for bonding a semiconductor chip.

The present invention envisions the use of aluminum as a surface material for a glass or alumina substrate and provides a method for bonding a semiconductor integrated circuit chip to the aluminum coated conductive surface. In the present case, chromium is used as a catalyst to facilitate the formation of a bond which is far superior to any prior silicon-to-aluminum bond.

In addition to providing a superior bond, the present method appears to avoid the formation of "purple plague," a purple phase which often occurs when bonding gold to aluminum and which proves deleterious to the strength of the bond.

It is therefore an object of the invention to provide a superior bonding method for joining semiconductor materials to aluminum coated circuit substrates.

Another object of the present invention is to provide aluminum-chromium contact materials which readily form strong bonds with gold-backed semiconductors while avoiding formation of "purple plague."

Other desirable objects of the invention will become more readily apparent from the following description of the invention.

DESCRIPTION OF THE PREFERRED EMBODIMENT

A major difficulty in prior integrated circuitry is the sensitivity to errors in the fabrication process, resulting in poor yield. Faulty components cannot be replaced, due to the integral nature of the integrated circuit. A need for improvement in the packaging and fabrication of microelectronic circuitry is therefore evident.

Figure 1:
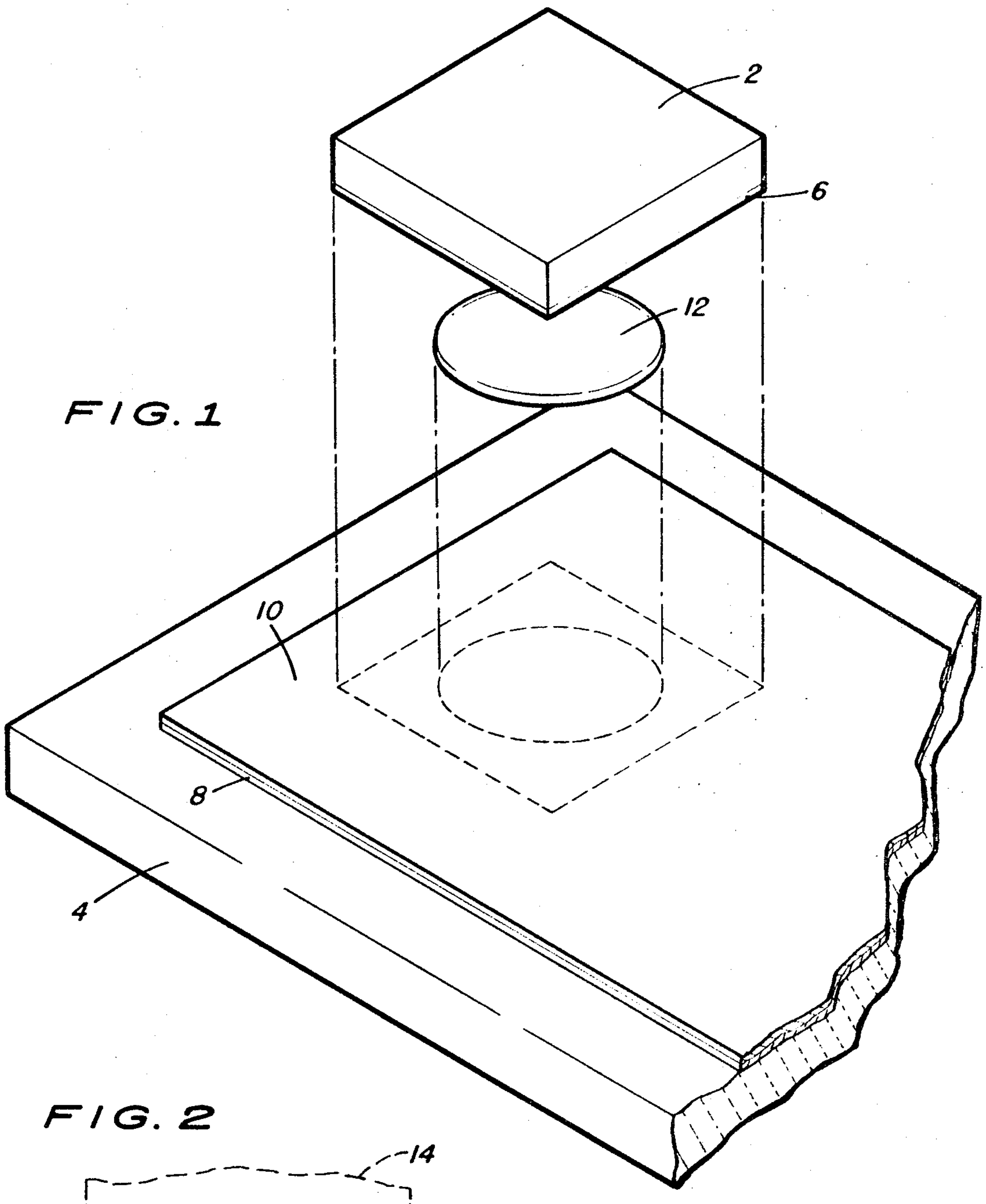
FIG. 1 depicts an exploded view in perspective of the objects to be bonded and the bonding means in sequential relationship.

According to the preferred method taught by the present invention, and illustrated in perspective in FIG. 1, an object such as a silicon die 2, which is to be bonded to a glass or alumina substrate 4, has its bonding surface provided with a thin layer 6 of pure metallic gold. The substrate 4 is provided with a thin first layer 8 and a thin second layer 10 of chromium and aluminum metals respectively, the chromium layer 8 contacting the surface of the glass or alumina substrate 6 which is to be bonded to the die 2. A gold-silicon preform 12, well-known to the art, provides molten adhesive means under the influence of heat and pressure when the procedure of the present method is followed.

A preferred method will be hereinafter described for bonding the gold-backed silicon die 2 to the substrate 4. It should be understood that the exact delineation of one preferred method taught by the invention does not limit the practice of the invention to the procedure herein described.

Figure 2:
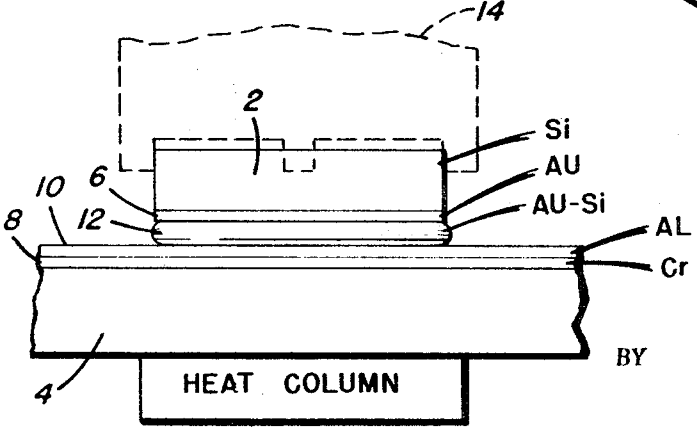
FIG. 2 shows the various objects and metallic layers of the bond in contacting relation under the pressure of a vacuum chuck, the assembly being under the thermal influence of a heat column.

Referring once again to the drawings, the alignment of the various elements to be bonded is shown in FIG. 1, while FIG. 2 depicts the various elements in a contacting relation as they are pressed together by a small vacuum chuck, a portion of which is shown at 14. For simplicity, the heat column necessary to the operation of the invention is schematically pictured, since the provision of heat in such an operation is well-known and understood.

According to the invention, the chromium and aluminum layered glass substrate 4 is placed on a heat column and subjected to a temperature of 410° C. for approximately 30 seconds. The gold-silicon preform 12 is then placed in contact with the aluminum layer 10 of the substrate 4 at the location of the proposed bond. The preform 12 is allowed to melt for approximately 15 seconds. The gold-backed die 2, or other gold-surfaced object to be bonded to the substrate, is located directly over the melted preform 12 with the aid of a small vacuum chuck 14 which applies a 75-gram pressure on the die 2. The die 2 is scrubbed gently until the molten metal of the preform has wet the gold surface layer 6 of the die 2. The pressure is then released and the resulting assembly allowed to cool, thereby solidifying the bond.

Due to the melting of the preform 12, expeditious application of the die 2 is of critical importance. If the molten preforms 12 are allowed to remain subject to the heat of the column for periods of time approaching 60 seconds or more without completing the above-described procedure, the preform will harden. If this hardening occurs, another gold-silicon preform must be placed directly over the first preform and caused to melt, thereby remelting the first preform and allowing an acceptable bond or completion of the procedure.

Bonding by the present method appears to exhibit a significant degree of success as measured by the strength of the bond and electrical characteristics. Pressure applied to break the bond usually cracks the integrated circuit chip or strips the aluminum layer 10 from the chromium layer 8. Also, the method seems to escape the "purple and white plagues" which weaken bonds formed between aluminum and gold. In the present case, the evident catalysis effect of the chromium produces the strong, impurity-free bond of the present invention.

Other applications of the present invention may be devised which depart from the exact method without departing from the spirit of the invention or the scope of the appended claims. Therefore, it should be understood that the invention is to be interpreted by the claims in light of the foregoing description but is not to be limited by the description.

What is claimed is:

1. A method for fabricating microelectronic components having surfaces on each of a number of elements which are to be joined together, the method comprising the steps of:

(a) placing a substrate on which chromium and aluminum metals are adhered in layered arrangement, the chromium being contiguous to the substrate and the aluminum layer being contiguous to the chromium, on a heat column whereupon the substrate and metallic layers are subjected to heat in a temperature range of 410° C. for a period of time approximating 30 seconds;

(b) placing a gold-silicon preform on the aluminum layer of the substrate and allowing the preform to melt;

(c) placing a gold-backed element to be bonded to the substrate directly over the molten preform and applying a pressure on the element and scrubbing gently to wet the gold surface of the element with the molten preform; and (d) releasing the pressure on the element on wetting of the gold surface and allowing the resulting assembly to cool, thereby effecting a bond between the substrate and the gold-backed element.

2. The method of claim 1 wherein the gold-silicon preform is allowed to melt for approximately 15 seconds before the application of the gold-backed element to be bonded to the substrate.

3. A method for fabricating microelectronic components and particularly for joining elements of said components, wherein the surface of a first element consists essentially of metallic gold and the surface of a second element consists essentially of metallic aluminum, comprising the steps of:

(a) applying chromium metal to at least a portion of the surface of the second element;

(b) placing a gold-silicon preform on at least a part of the area of said portion of the surface of the second element;

(c) heating the gold-silicon preform to cause melting thereof;

(d) engaging the metallic gold surface of the first element with the heated preform; and (e) allowing the resulting assembly to cool, thereby effecting a bond between the elements.

4. A method for fabricating microelectronic components and particularly for joining elements of said components, wherein the surface of a first element consists essentially of metallic gold and the second element has chromium and aluminum metals adhered thereto in layered arrangment, the chromium being contiguous to said second element and the aluminum layer being contiguous to the chromium, comprising the steps of:

(a) placing a gold-silicon preform on the aluminum layer of the second element;

(b) heating the gold-silicon preform to cause melting thereof;

(c) engaging the metallic gold surface of the first element with the heated preform; and, (d) allowing the resulting assembly to cool, thereby effecting a bond between the elements.

References Cited

UNITED STATES PATENTS

| | | | |
|---|---|---|---|
| 3,025,439 | 3/1962 | Anderson | 29—590X |
| 3,042,550 | 7/1962 | Allen et al. | 29—473.1X |
| 3,093,882 | 6/1963 | Emeis | 29—590X |
| 3,131,460 | 5/1964 | Allen | 29—473.1X |
| 3,173,201 | 3/1965 | Motson | 29—473.1 |
| 3,270,256 | 8/1966 | Mills et al. | 29—589UX |
| 3,298,093 | 1/1967 | Cohen | 29—473.1 |
| 3,316,628 | 5/1967 | Lang, Jr. | 29—473.1X |
| 3,453,724 | 7/1969 | Gilbert | 29—473.1X |

JOHN F. CAMPBELL, Primary Examiner

R. J. SHORE, Assistant Examiner

U.S. Cl. X.R.

29—473.1, 501, 504, 590